(12) United States Patent
Leu

(10) Patent No.: US 7,057,897 B2
(45) Date of Patent: Jun. 6, 2006

(54) MEANS FOR SECURING A COOLING DEVICE

(75) Inventor: Chii-Ming Leu, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 30 days.

(21) Appl. No.: 10/819,218

(22) Filed: Apr. 7, 2004

(65) Prior Publication Data

US 2005/0225944 A1  Oct. 13, 2005

(51) Int. Cl.
*H05K 7/20* (2006.01)

(52) U.S. Cl. ............... 361/704; 361/703; 361/717; 361/718; 361/719; 257/718; 257/713; 257/719; 165/80.2; 165/80.3; 24/453

(58) Field of Classification Search ............. 24/453; 361/704; 257/719
See application file for complete search history.

(56) References Cited

U.S. PATENT DOCUMENTS

| | | | |
|---|---|---|---|
| 5,730,210 A * | 3/1998 | Kou | 165/80.3 |
| 6,307,748 B1 * | 10/2001 | Lin et al. | 361/704 |
| 6,643,137 B1 * | 11/2003 | Chung et al. | 361/719 |
| 6,688,379 B1 * | 2/2004 | Huang et al. | 165/121 |
| 6,725,906 B1 * | 4/2004 | Lin et al. | 361/695 |
| 6,859,368 B1 * | 2/2005 | Yang | 361/704 |
| 6,865,082 B1 * | 3/2005 | Huang et al. | 361/700 |

* cited by examiner

*Primary Examiner*—Lynn Feild
*Assistant Examiner*—Zachary Pape

(57) ABSTRACT

Means for securing a cooling device includes a main body attached to the cooling device and at least a secure unit. The main body provides at least an axial hole corresponding to the secure unit. The secure unit provides a secure component, which is disposed in the axial hole, and an elastic member, which is disposed in the axial hole to surround the secure component, with a locator being inserted into the engaging part of the main body. The secure unit is biased by the elastic member against the electronic component on the circuit board under a condition of no relative movement and no abrasive wear occurring between the elastic member and the main body due to the locator being inserted into the engaging part. Therefore, no chippings are created to fall down to the circuit board.

1 Claim, 5 Drawing Sheets

MEANS FOR SECURING A COOLING DEVICE

BACKGROUND OF THE INVENTION

1. Field of the Invention

The present invention is related to a secure device and particularly to a secure device, which can be used for securing radiation module to avoid occurring chippings.

2. Brief Description of the Related Art

Due to technology progressing incessantly, the central processing unit (CPU) in the notebook or any other high speed computers provides much faster operation speed. As a result, it is necessary to mount a radiator to the CPU for dissipating generated high heat during running.

Referring to FIG. 1, Taiwanese Patent Publication No. 564007 discloses a fixing device 7 of a radiator and a radiation module 8 is provided above the fixing device 7. The radiation module 8 is composed of heat guide tube 81 and an extending outward main body 82. The fixing device 7 is used for the radiation module 8 being able to contact a base plate 70 tightly and the base plate 70 is fixed to the upper surface of the electronic component 90 so that the surface area increased by the cooling fins 821 formed by way of the heat guide tube 81 and the main body 82 on the base plate 70 can guide the heat generated by the electronic component 90 outward via the heat guide tube 81 and the heat can dissipate to the open air to achieve effect of heat removal. The fixing device 7 itself is attached to a printed circuit board 91 on which the electronic component 90 is provided, and a reinforced plate 92 is under the printed circuit board 91. The fixing device 7 also has a plurality of holes 72 corresponding to the number of the fastening modules 71.

Referring to FIG. 2, the fastening module 71 is composed of a fastening member 711, an elastic member 712 fitted to the fastening member 711, an outer cover 713 on the elastic member 712 and a secure member 714 under the elastic member 712. When the fixing device 7 is mounted to the printed circuit board 91, the fastening member 711 is attached with the elastic member 712 and passes through the hole 72 in the base plate 70 to engage with a plurality of threaded holes 911 in the printed circuit board 91 via the fastening member 711. Finally, the fastening member 711 keeps contact with the secure member 711.

The preceding elastic member 712 is used for executing a snug pressure to the electronic component 90 to allow heat generated from the electronic component 90 transmitting to the radiation module 8 via the base plate 70 so as to dissipate the heat sufficiently. The base plate 70 is normally made of aluminum, which is apt to remove the heat. When the fastening member 711 engages with the threaded holes 911 in the printed circuit board 91, the elastic member 712 usually is a spring and rotates with the fastening member 711 with high speed during assembling. Under this circumference, the base plate 70 becomes worn out due to contacting the sharp end of the elastic member 712 so that it generates metal chippings falling down to the printed circuit board 91 to result in short circuit. This is a puzzle while circuit test is done subsequently.

SUMMARY OF THE INVENTION

An object of the present invention is to provide a secure device, which can avoid the chippings during assembling the radiation module. The basic concept of the present invention is to resist the elastic component from rotating so as to prevent occurring wear-out and producing metal chippings.

The secure device of a radiation module according to the present invention is capable of removing heat generated by at least electronic component on a circuit board and includes a radiation module and at least a secure unit, which allows the radiation module contacting and being joined to the circuit board.

The radiation module has a main body and a cooling unit on the main body keeping contact with electronic component. The main body has an axial hole and an engaging part and the cooling unit has a secure component disposed in the axial hole and providing an elastic member, which is disposed in the axial hole and surrounds the secure component, with a locator engaging with the engaging part of the main body so as to be retained in the main body.

During the radiation module being attached to the circuit board, the secure unit is biased by an urging force of the elastic member against the electronic component of the circuit board and the elastic member can keep no relative movement with the main body due to the locator engaging with the engaging part so that the main body is incapable of wear-out and it is not possible to create chippings to result in short circuit of the circuit board.

The radiation module further includes at least a support base with a surrounding wall defining the axial hole and a longitudinal slot provided on the surrounding wall as the engaging part and the elastic member has a jut section as the locator so that that the jut section can engage with the slot.

The elastic component is a spring with a coil section and the jut section is below the coil section and perpendicular to the axial direction of the elastic member for engaging with the slot. The secure component is a screw with a screw rod and a head; the screw rod is slightly longer than the axial hole with a large diameter section and a small diameter section; the small diameter section is provided with screw threads to engage with the circuit board via passing through the axial hole.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE PREFERRED EMBODIMENT

Figure 1:
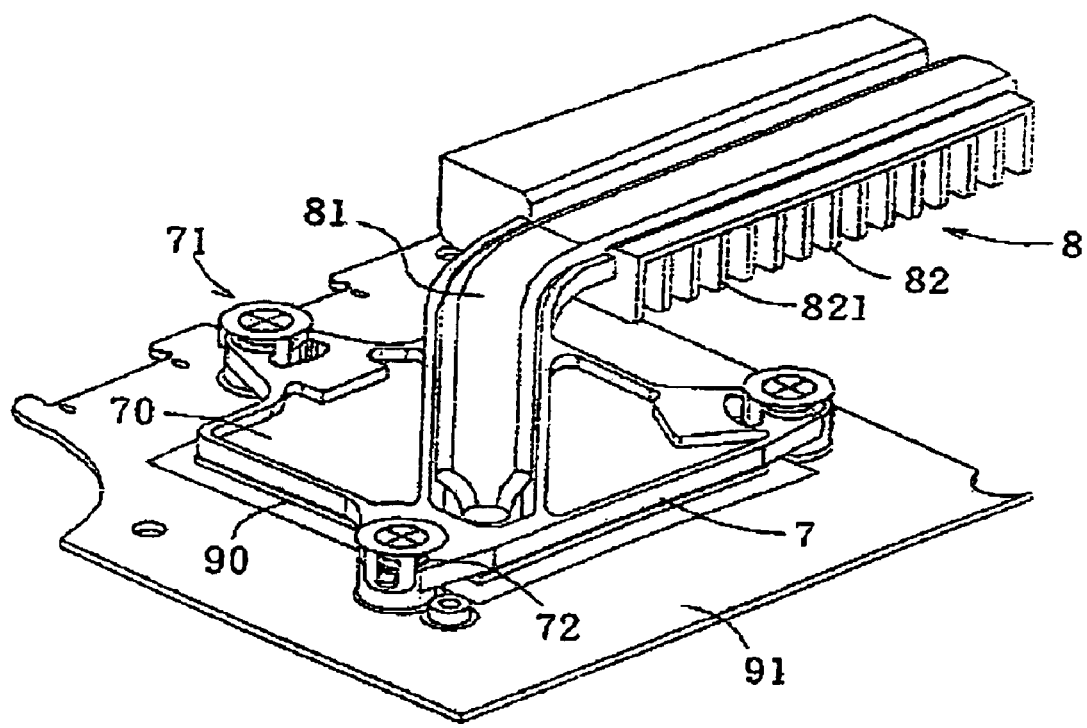
FIG. 1 is a perspective view of a conventional secure device of a radiator.
Figure 2:
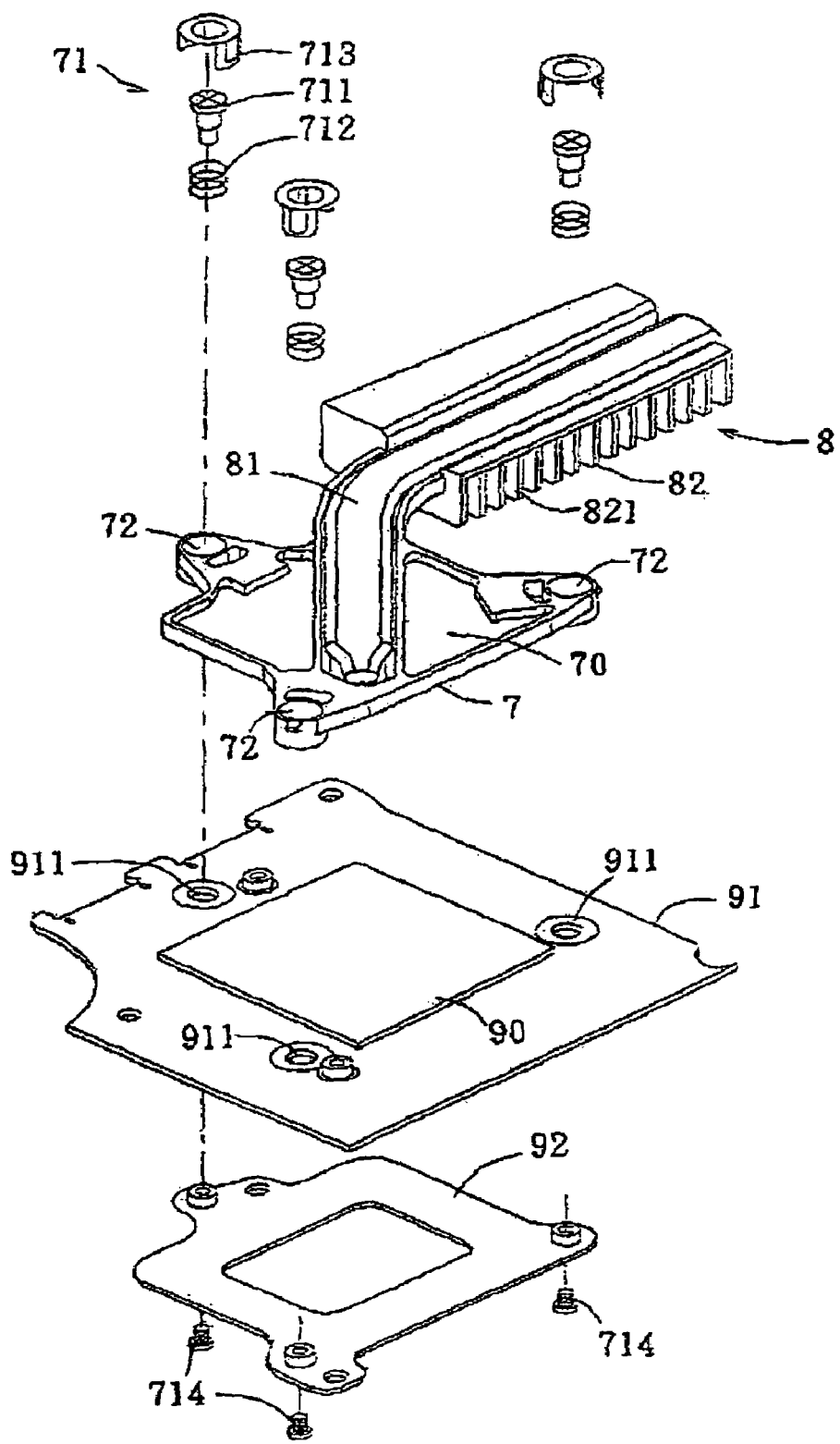
FIG. 2 is an exploded perspective view illustrating components of the secure device shown in FIG. 1.
Figure 3:
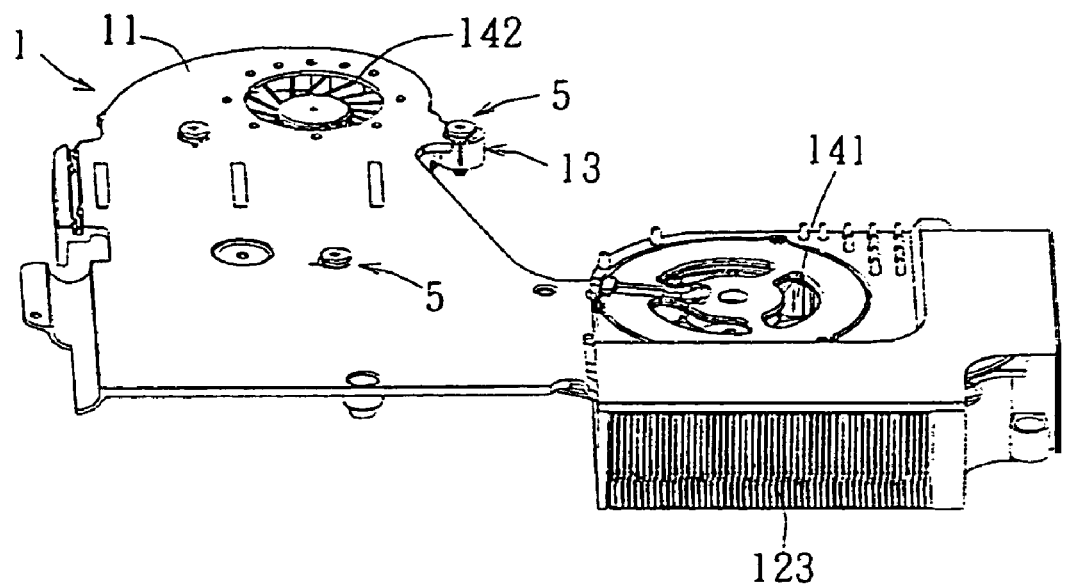
FIG. 3 is an oblique view of a secure device for a radiation module according to the present invention.

Referring to FIG. 3, a secure device for radiation module according to the present invention is primarily used for cooling the central processing unit on the main board of a lap top computer. The secure device at least has a secure unit 5. It is noted that the secure unit 5 is not limited to be secured to the radiation module 1 of the central processing unit in the lap top computer and it also can be attached to other kinds of circuit boards. Besides, due to three-point fastening needing less area than four-point fastening and being easy to control the integral secure pressure, the secure unit 5 of three point fastening is taken as an example for explaining the way to be assembled to the radiation module 1.

It can be seen in FIG. 3 that the radiation module 1 has a metallic main body 11 and a cooling unit 12, which is on the main body 11 and faces the electronic component 32. The cooling unit 12 is a square heat guiding plate 121 with an extending outward heat guide pipe 122 and a plurality of cooling fins 123. There are two cooling fans 141, 142 on the main body 11 with the cooling fan 141 being disposed at the cooling fins 123 and the cooling fan 142 being disposed next to the heat guide plate 121. In order to obtain effect of heat dissipation, the radiation module 1 of the preferred embodiment has the cooling unit 12 thereof to contact the electronic component 32 with the heat guide plate 121. Because the structure and principle regarding to the radiation module 1 is not the point of the present invention, no detail will be description further.

The secure unit 5 is utilized to allow the heat guide plate 121 contacting the electronic component 32 and engaging with the circuit board 31. The secure unit 5 has a secure member 51 and a spring member 52 and both the secure member 51 and the spring member 52 are disposed in an axial hole 111 in a way of the spring member 52 surrounding the secure member 51. The spring member 52 is provided with a locator 521 to engage with an engaging part 112 of the main body 11 so as to retain on the main body 11.

The main body 11 of the radiation module 1 further provides three support bases 13 and the axial hole 111 is defined with the surrounding wall 131 of each support base 13. The surrounding wall 131 has a vertical slot as the engaging part 112. The locator 521 of spring member 52 is a jut section. During assembling, the spring member 52 has the jut section thereof engaging with the slot of the respective support base 13 so that the spring member 52 can be limited in the axial hole 111. Alternatively, an engaging hole can be provided in the respective support base 13 and the spring member 52 can be provided with a hook section instead of the slot and the jut section respectively such that the hook section can engage with the engaging hole to keep the spring member 52 in place.

The elastic member 52 in the preferred embodiment is a spring with a coil section 522 and the locator 521 is disposed below the coil section 522 to extend outward in a way of being perpendicular to the axial direction of the coil section 522 such that the slot of the support base 13 can engage with the locator 521. Besides, the secure component 511 in the preferred embodiment is a screw with screw rod and a head. The screw rod has a length slightly longer than the axial hole 111 and provides a large diameter section 511 and a small diameter section 512. The small diameter section 512 has screw threads and pierces the axial hole to engage with the circuit board 31. Further, the secure unit 5 has a C-retaining ring 53 and an annular recess 513 is disposed between the large diameter section 511 and the small diameter section 512 so that the C-retaining ring 53 can retain the secure component 51 to the support base 13.

Figure 4:
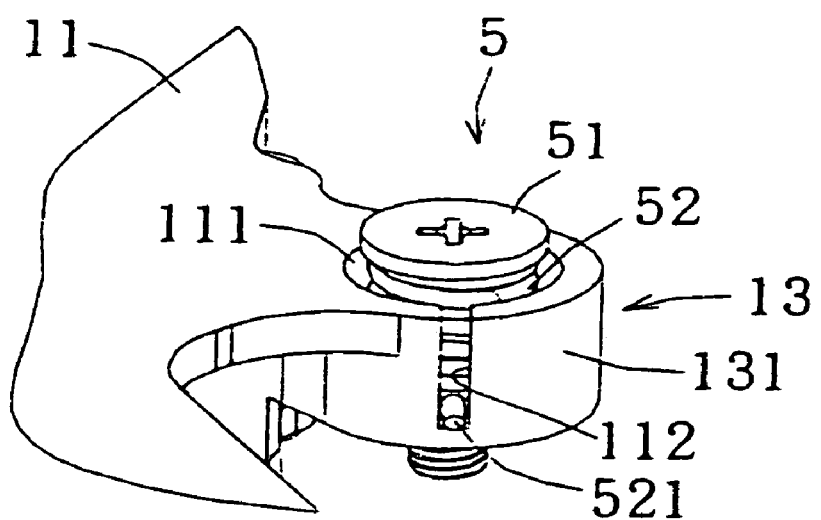
FIG. 4 is an enlarged fragmentary perspective view of FIG. 3 illustrating a secure unit fastening to a support base of the radiation module according to the present invention.
Figure 5:
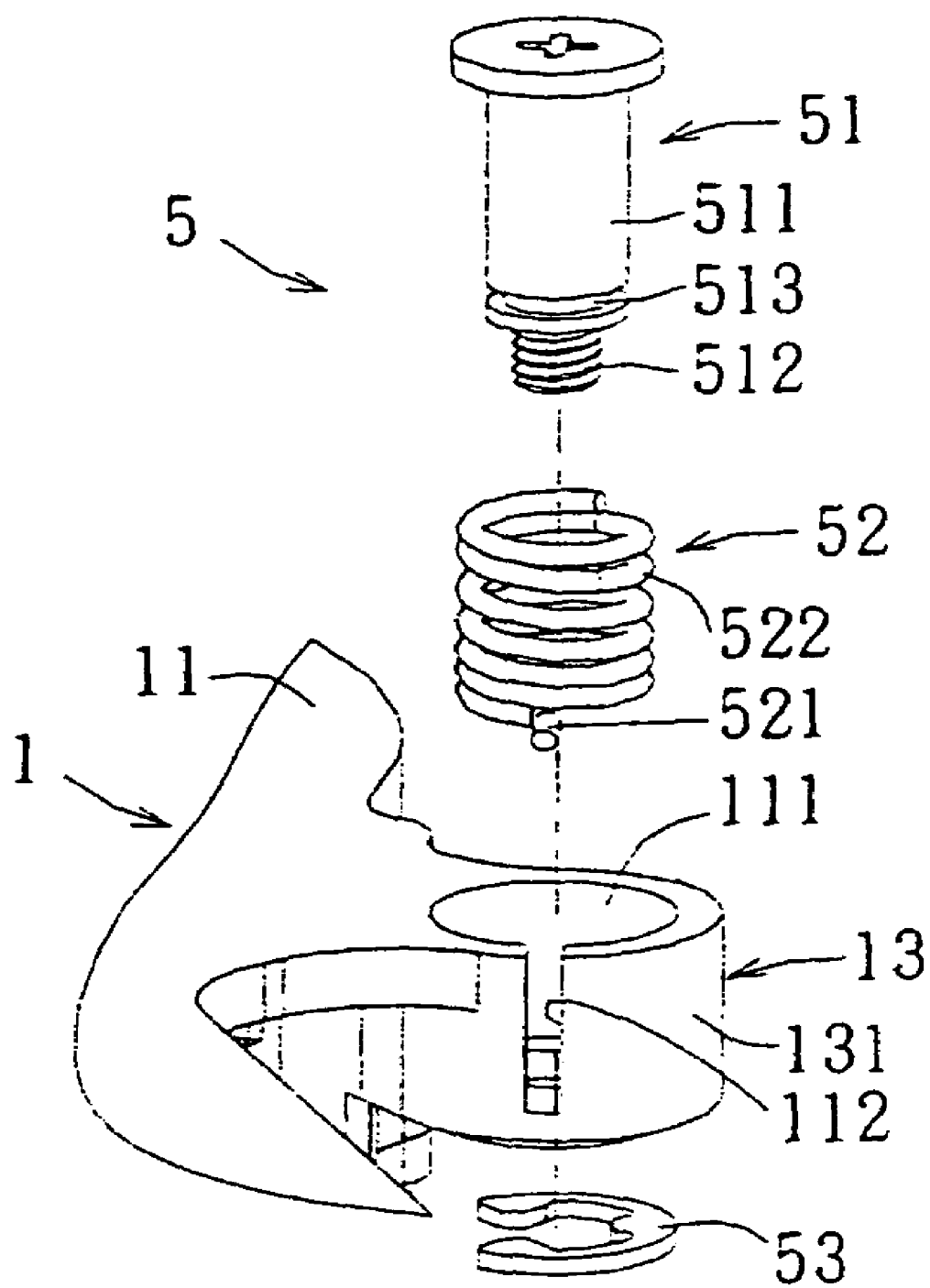
FIG. 5 is an exploded perspective view of the secure device shown in FIG. 4.
Figure 6:
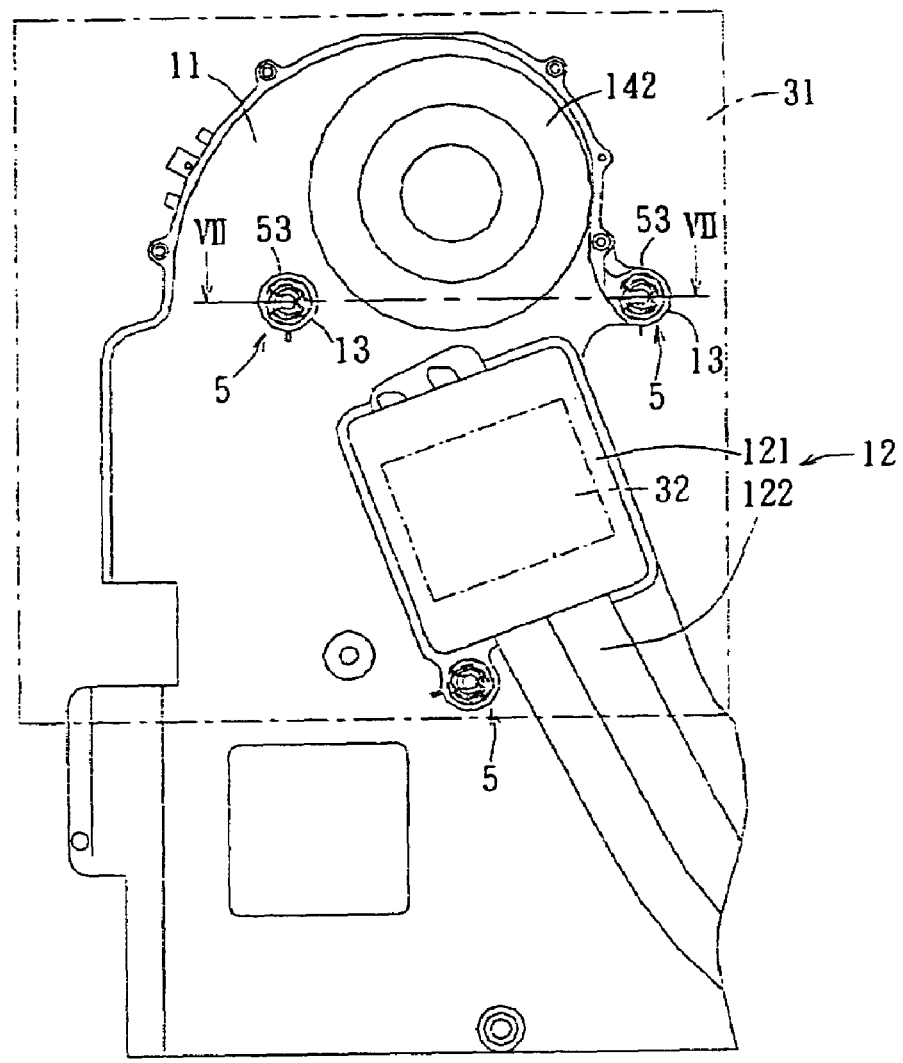
FIG. 6 is a top view of the radiation module according to the present invention.
Figure 7:
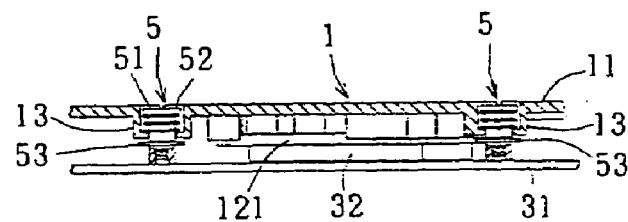
FIG. 7 is a sectional view along line VII—VII illustrating the secure device of the present invention associated with the radiation module and a circuit board for the electronic components being able to keep contact with the cooling fins of the radiation module.

Referring to FIG. 7 in company with FIG. 4, an urging force of the elastic component 52 can bias the heat guide plate 121 of the radiation module 1 against the electronic component 32 of the circuit board 31 and the locator 521 on the elastic component 52 can be mounted to the engaging part 112 of the main body 11 in advance such that no relative abrasive wear movement between the elastic component 52 and both the inner side and the bottom of the support base 13 the main body 11 can occur and no chippings can fall down to the circuit board 31 to result in short circuit.

It is appreciated that the secure device of radiation module according to the present invention can prevent wear-out resulting from relative wearing movement between the elastic unit and the main body due to the locator of the elastic component 52 engaging with the slot of the main body. In this way, no chippings drops down to the circuit board 31 and it can be free from short circuit.

While the invention has been described with referencing to preferred embodiments thereof, it is to be understood that modifications or variations may be easily made without departing from the spirit of this invention, which is defined by the appended claims.

What is claimed is:

1. Means for securing a cooling device, comprising:
   a main body, providing a flat shaped plate, being attached to the cooling device and having at least an axial hole extending downward with a surrounding wall, which has a vertical slot;
   at least a secure unit, being disposed in the axial hole to engage with the circuit board;
   wherein, the secure unit further comprising:
   a secure component, having a post part extending downward from a head thereof with an annular recess to form a neck section at the lower end thereof extending outward the axial hole and a screw part extending downward from the lower end with a diameter and a length thereof smaller than the post part for engaging with a circuit board under the main body;
   a spring, providing a coil section surrounding the post part of the secure component and a locator extending outward horizontally from the lower end of the coil section to insert into the vertical slot; and
   a retaining ring, being located at the neck section for retaining the secure component in place.

* * * * *